United States Patent [19]

Thierfelder

[11] 3,786,317

[45] Jan. 15, 1974

[54] MICROELECTRONIC CIRCUIT PACKAGE

[75] Inventor: William George Thierfelder, Easton, Pa.

[73] Assignee: Bell Telephone Laboratories Incorporated, Berkeley Heights, N.J.

[22] Filed: Nov. 9, 1972

[21] Appl. No.: 305,051

[52] U.S. Cl. ...... 317/234 R, 317/234 E, 317/234 N

[51] Int. Cl. ............................................. H01l 5/00

[58] Field of Search ................ 317/234; 174/52 PE, 174/DIG. 3

[56] References Cited

UNITED STATES PATENTS

| | | | |
|---|---|---|---|
| 3,423,516 | 1/1969 | Segerson | 174/52 |
| 3,569,797 | 3/1971 | Simmons | 317/234 |
| 3,114,866 | 12/1963 | Iwata | 317/234 |

*Primary Examiner*—Rudolph V. Rolinec
*Assistant Examiner*—E. Wojciechowicz
*Attorney*—C. E. Graves

[57] ABSTRACT

A package for microelectronic circuits is disclosed in which the mounting mechanism isolates the circuit chip and encapsulating plastic from any applied stress when mounted. The mechanical force of the mounting mechanism is applied to a pair of tabs extending upward from a combination base/heat sink. This permits the applied stress to bypass the encapsulant and be transmitted directly to the heat sink and the mechanical support.

4 Claims, 5 Drawing Figures

MICROELECTRONIC CIRCUIT PACKAGE

BACKGROUND OF THE INVENTION

This invention relates to the packaging of microelectronic circuits and more particularly to such packages adapted for automatic assembly and encapsulation.

A common method of packaging microelectronic circuits is to merely encapsulate the circuit chip and its connected terminals in plastic. However, care must be taken that this type of package is not subjected to mechanical stress in being mounted for assembly into a larger circuit. Applied mechanical stress can have a deleterious effect upon the active chip of the circuit package. Since plastic is quite resilient, any stress applied to the plastic in mounting the encapsulated package is transmitted through the encapsulant to the circuit chip itself.

Therefore, it is an object of my invention to provide a means for mounting a microelectronic circuit package which will isolate the encapsulant and the circuit chip from any applied stress due to mounting.

It is also an object of my invention to provide an encapsulating package for a microelectronic circuit chip which contains a minimum amount of resilient material.

It is still a further object of my invention to provide a package having the above objects and including a minimum number of assembly steps, which are readily automated.

SUMMARY OF THE INVENTION

To isolate a microelectronic circuit chip and its encapsulant from applied mechanical stress due to mounting, a package configuration includes an extension of the base, permitting the mounting stress to be transmitted directly through the package to the mounting base without stressing the encapsulant or the chip.

In a specific embodiment of my invention a metal base, on which the microelectronic circuit chip is bonded, includes keystone-shaped tabs extending perpendicular to the mounting surface. Since the larger dimension of the keystone is more distant from the mounting surface, the encapsulating material surrounding the chip is held in position by the tabs. The encapsulant provides a box-like cover over the chip whose upper surface is below the plane of the tab ends. This permits mounting stress to be applied to the tabs without stressing the resilient encapsulant or the chip.

DESCRIPTION OF THE ILLUSTRATIVE EMBODIMENT

The package of my invention is advantageously manufactured by an automated process in which a plurality of circuits are packaged on a continuously fed line, with the various assembly steps taking place along the line. To illustrate the assembly process and describe the package, it is necessary only to follow a single element along the assembly process.

Figure 1:
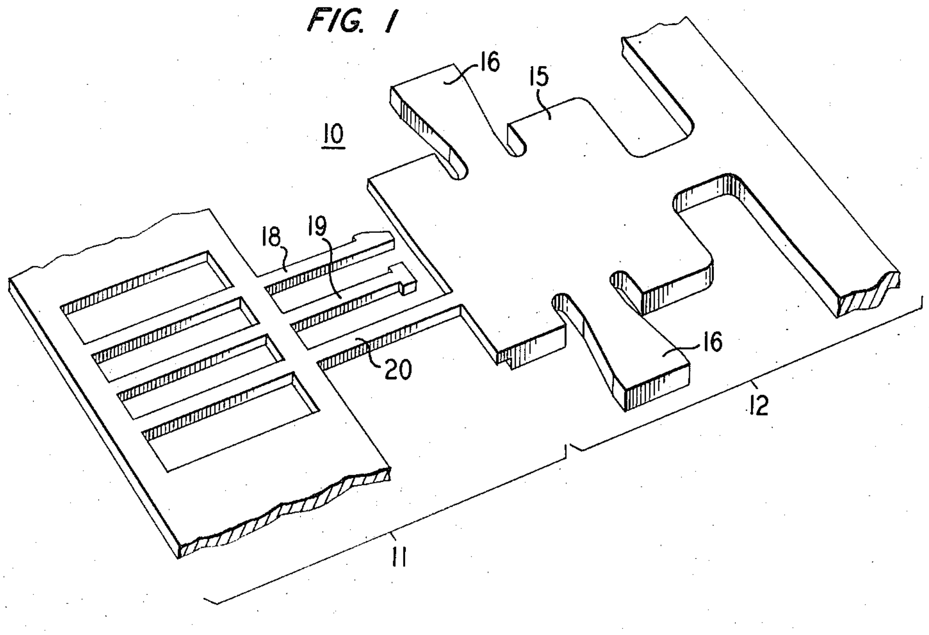
FIG. 1 is a perspective view of a punched metal strip which will form the base, heat sink and terminals for the circuit package embodying my invention.

The first step in the manufacture of the package is to punch the configuration shown in FIG. 1 from a dual thickness strip of metal 10. The strip 10 has a thinner section 11, as shown on the left side of FIG. 1, and a thicker section 12, as shown on the right side of FIG. 1. Section 12 includes a generally square shape combination base and heat sink 15, which is typically 0.050 inch in thickness, from which two keystone shaped tabs 16 project. The thinner section 11, which is typically 0.015 inch in thickness, forms the three terminals 18, 19 and 20. As can be seen, sufficient bridges are maintained so that the element of FIG. 1 is mechanically stable and is carried along by the balance of master strip 10. An example of the material used for strip 10 would be a clad sandwich structure of nickel and copper in which a 0.015 inch layer of nickel (shown on top in the drawing) becomes section 11. The balance of section 12 is a copper layer of 0.037 inch beneath the nickel layer and a second very thin nickel layer of 0.003 inch beneath the copper to prevent corrosion. The copper and nickel layers are not shown on the drawing.

Figure 2:
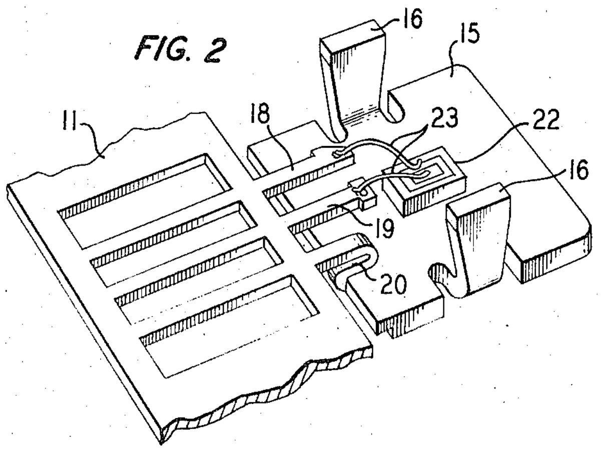
FIG. 2 is a perspective view of the circuit chip positioned on the strip of FIG. 1 and connected to the terminals.

The next step in the assembly of the package is to bend the terminal 20 into an s-shape upward and over the combination base and heat sink 15. This also positions terminals 18 and 19 above the surface of base 15, as seen in FIG. 2. At the same time, keystone tabs 16 are bent substantially perpendicular to the plane of the heat sink 15. Following the bending operation, an active circuit chip 22 is bonded to the central region of heat sink 15 and connected via leads 23 to terminals 18 and 19.

As with other microelectronic circuits, the bonding of chip 22 to heat sink 15 is accomplished by either thermocompression bonding or by eutectic bonding. This assumes that the thermal expansion match between chip 22 and heat sink 15 is reasonably close. If a thermal expansion mismatch occurs, several alternative structures are used to reduce stresses which would be induced in chip 22 by the mismatch.

A first alternative is to bond chip 22 to an intermediate metal part (not shown), such as molybdenum. A second alternative is to clad a metal layer (not shown), such as molybdenum, onto heat sink 15 in the raw material stage. A third alternative is to provide a compliant intermediate layer (not shown), such as gold, between chip 22 and heat sink 15.

The bonded chip 22 and the connections to terminals 18 and 19 must be protected, by encapsulant 25 for example. One possible encapsulant material is moldable plastic, such as silicone molding compound 307 available commercially from Dow Corning Corporation, Midland, Michigan. Since some shrinkage is bound to occur as the encapsulant changes from a viscous "liquid" to a rigid "solid," care should be exercised that excessive mechanical stresses are not created in chip 22. Where this potential problem is seriously encountered, a coating of non-rigid, resin coating (not shown), such as Dow Corning's silicone elastomer 6101, placed over chip 22 prior to being encapsulated, should effectively mechanically decouple the chip and encapsulant 25.

Figure 3:
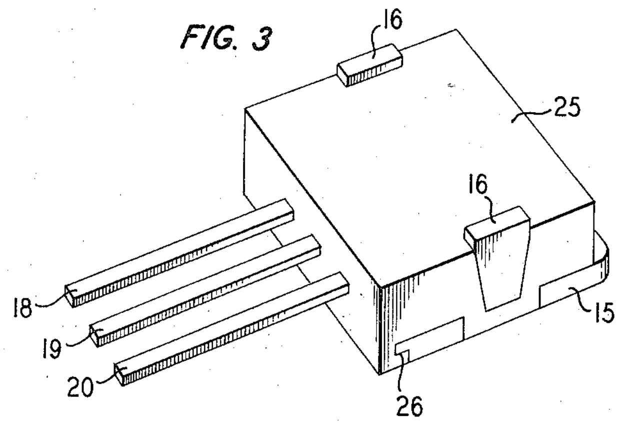
FIG. 3 is a perspective view of an encapsulated package of the chip shown in FIG. 2 with the excess metal trimmed away.
Figure 4:
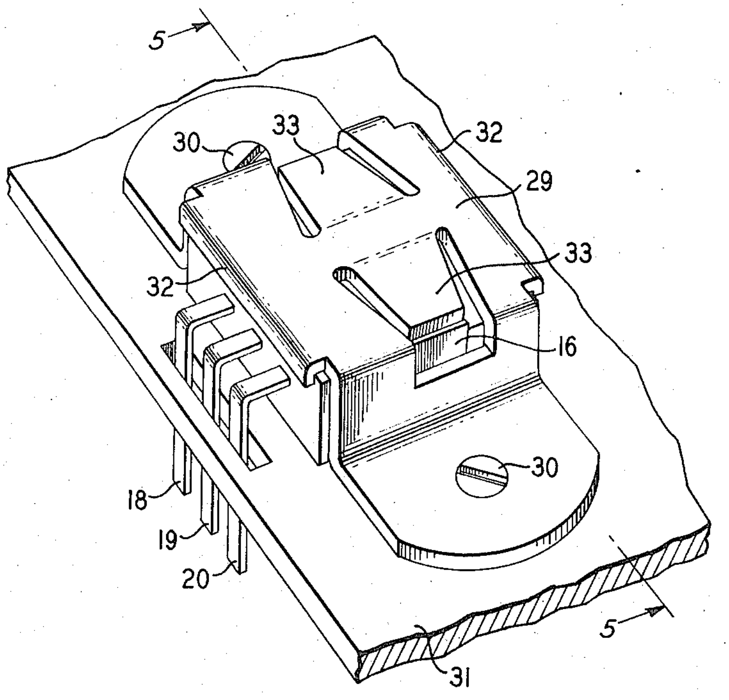
FIG. 4 is a perspective view of the package of FIG. 3 mounted on an underlying base.

Following the encapsulation, the balance of the material connecting heat sink 15 to the thick portion 12 of master strip 10 and the thin portion connecting terminals 18, 19 and 20 to the thin portion 11 of master strip 10 is cut away. As FIG. 3 readily shows, the encapsulant 25 is locked into position by keystone tabs 16 and by overhang 26 formed at the intersection of thin portion 11 and thick portion 12. As can be seen, the upper surfaces of tab 16 are above the plane of the top surface of encapsulant 25.

Figure 5:
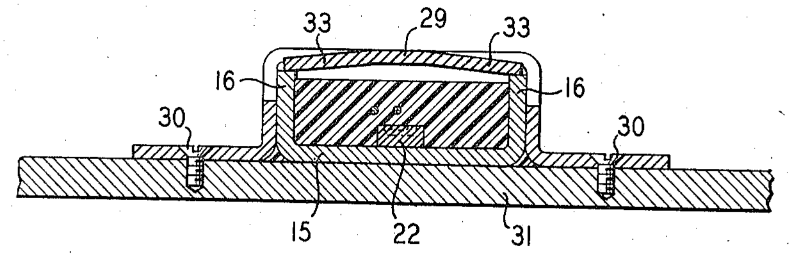
FIG. 5 is a cross-section view of the mounted package of FIG. 4 taken along the indicated line.

The encapsulated package may now be mounted by using a cap 29 which is fastened by screws 30 to a connecting board 31. Cap 29 includes side rails 32 which position the encapsulated package and prevent its sideways movement. Locking tabs 33, cantilevered from the center position of cap 29, are deformably forced by the clamping action of screws 30 into bent-over engagement with the end portion of tabs 16. In this deformed position, locking tabs 33 provide a predictable force to the keystone tabs 16. As can be seen even clearer in the cross-sectional view of FIG. 5, the stresses applied to tabs 16 by locking tabs 33 is transmitted directly to the heat sink in base 15 and from there to the connecting board 31. None of the applied stress acts on circuit chip 22 which is isolated from the effects of the mounting force.

Although tabs 16 have been described as keystone-shaped, it should be apparent that other shapes will be as effective. All that is required is that a cross-sectional dimension at the outer end of the tab exceed a corresponding dimension in the vicinity of the base area 15. Such a shape would include a truncated cone or pyramid and a straight tab twisted 90 degrees on its axis. Although more difficult to manufacture, a pair of tabs on opposite sides of base 15 and bent closer to each other at the outer end would also be effective.

It is to be understood that the embodiment described herein is merely illustrative of the principles of this invention. Various modifications could be made by persons skilled in the art without departing from the spirit and scope of my invention.

What is claimed is:

1. A packaged microelectronic circuit comprising a base to which the circuit is affixed;

a plurality of tabs attached to the base and extending substantially perpendicularly upwards therefrom;

a portion of each tab having a smaller cross-sectional dimension than a corresponding dimension at the remote end and spaced apart therefrom;

means for encapsulating the circuit and at least a portion of each tab, whereby the encapsulating means is secured to the package by the interference between the encapsulant and the material of the tab beneath the remote end; and cap means for engaging the ends of the tabs remote from the base to mount the package in a desired position without applying stress to the encapsulant.

2. A packaged circuit in accordance with claim 1 wherein each tab has a substantially keystone shape.

3. A packaged circuit in accordance with claim 2 wherein the encapsulating means is plastic molded in a box-like shape having its upper surface below the plane of the remote ends of the tabs.

4. A packaged circuit in accordance with claim 3 wherein the engaging means include means to prevent lateral movement of the package; and members to engage the tabs and prevent movement of the package relative to the plane of the base.

* * * * *

UNITED STATES PATENT OFFICE
CERTIFICATE OF CORRECTION

Patent No. 3,786,317 Dated January 15, 1974

Inventor(s) William George Thierfelder

It is certified that error appears in the above-identified patent and that said Letters Patent are hereby corrected as shown below:

Item [73] Assignee:, second line, change "Berkeley Heights" to --Murray Hill--.

Signed and sealed this 24th day of September 1974.

(SEAL)
Attest:

McCOY M. GIBSON JR.
Attesting Officer

C. MARSHALL DANN
Commissioner of Patents

FORM PO-1050 (10-69)

USCOMM-DC 60376-P69
★ U.S. GOVERNMENT PRINTING OFFICE : 1969 O—366-334.